United States Patent
Oberli et al.

(10) Patent No.: US 7,716,819 B2
(45) Date of Patent: May 18, 2010

(54) DEVICE AND METHOD FOR TURNING OVER ELECTRONIC COMPONENTS

(75) Inventors: Marco Oberli, La Chaux-de-Fonds (CH); Pascal Dromard, Montlebon (FR)

(73) Assignee: Ismeca Semiconductor Holdings SA, La Chaux-De-Fonds (CH)

( * ) Notice: Subject to any disclaimer, the term of this patent is extended or adjusted under 35 U.S.C. 154(b) by 0 days.

(21) Appl. No.: 12/120,551

(22) Filed: May 14, 2008

(65) Prior Publication Data

US 2008/0273950 A1 Nov. 6, 2008

Related U.S. Application Data

(63) Continuation of application No. PCT/EP2006/067910, filed on Oct. 30, 2006.

(30) Foreign Application Priority Data

Nov. 15, 2005 (CH) .................................. 1834/05

(51) Int. Cl.
*B23P 19/00* (2006.01)
*B07C 1/18* (2006.01)
*B08B 9/08* (2006.01)

(52) U.S. Cl. ........................... 29/740; 901/40; 414/737; 414/751.1; 414/763; 414/773; 414/776; 414/222.13

(58) Field of Classification Search ................ 141/124; 198/377.04, 379, 397.04, 397.05, 402–404, 198/410–411, 414, 416, 471.1, 612, 377.02, 198/476.1; 33/289; 414/754, 758–769, 771, 414/773, 783, 774, 775, 776, 778, 779, 780, 414/781, 782, 737

See application file for complete search history.

(56) References Cited

U.S. PATENT DOCUMENTS

| 2,240,093 | A | * | 4/1941 | Farris | 198/377.02 |
| 3,208,579 | A | * | 9/1965 | Perrier et al. | 198/377.01 |
| 4,057,149 | A | * | 11/1977 | Clarke | 414/737 |
| 4,135,630 | A |  | 1/1979 | Snyder et al. | |
| 4,666,358 | A | * | 5/1987 | Wojciechowski | 414/223.01 |
| 5,403,146 | A | * | 4/1995 | Jones | 414/783 |
| 6,468,023 | B1 |  | 10/2002 | Hilmoe | |

FOREIGN PATENT DOCUMENTS

| DE | 4022486 C1 | * | 8/1991 |
| JP | 52156475 A | * | 12/1977 |
| WO | WO 0054564 A1 | * | 9/2000 |
| WO | 2004023858 A | | 3/2004 |

OTHER PUBLICATIONS

International Search Report dated Feb. 21, 2007.

* cited by examiner

*Primary Examiner*—Gregory W Adams
(74) *Attorney, Agent, or Firm*—Pearne & Gordon LLP

(57) ABSTRACT

Device for turning over electronic components, comprising a turntable (1) for driving the electronic components to be turned over in succession between the following stationary locations: a location (A) for loading them onto the turntable; a start of turning over location (B); an end of turning over location (C); and a location (D) for unloading the turntable. A turning-over device (2) actuated by a fixed rotating motor (21), not linked to said turntable, allows the electronic components to be turned over between the start of turning over position and the end of turning over position.

19 Claims, 2 Drawing Sheets

DEVICE AND METHOD FOR TURNING OVER ELECTRONIC COMPONENTS

Figure 1:
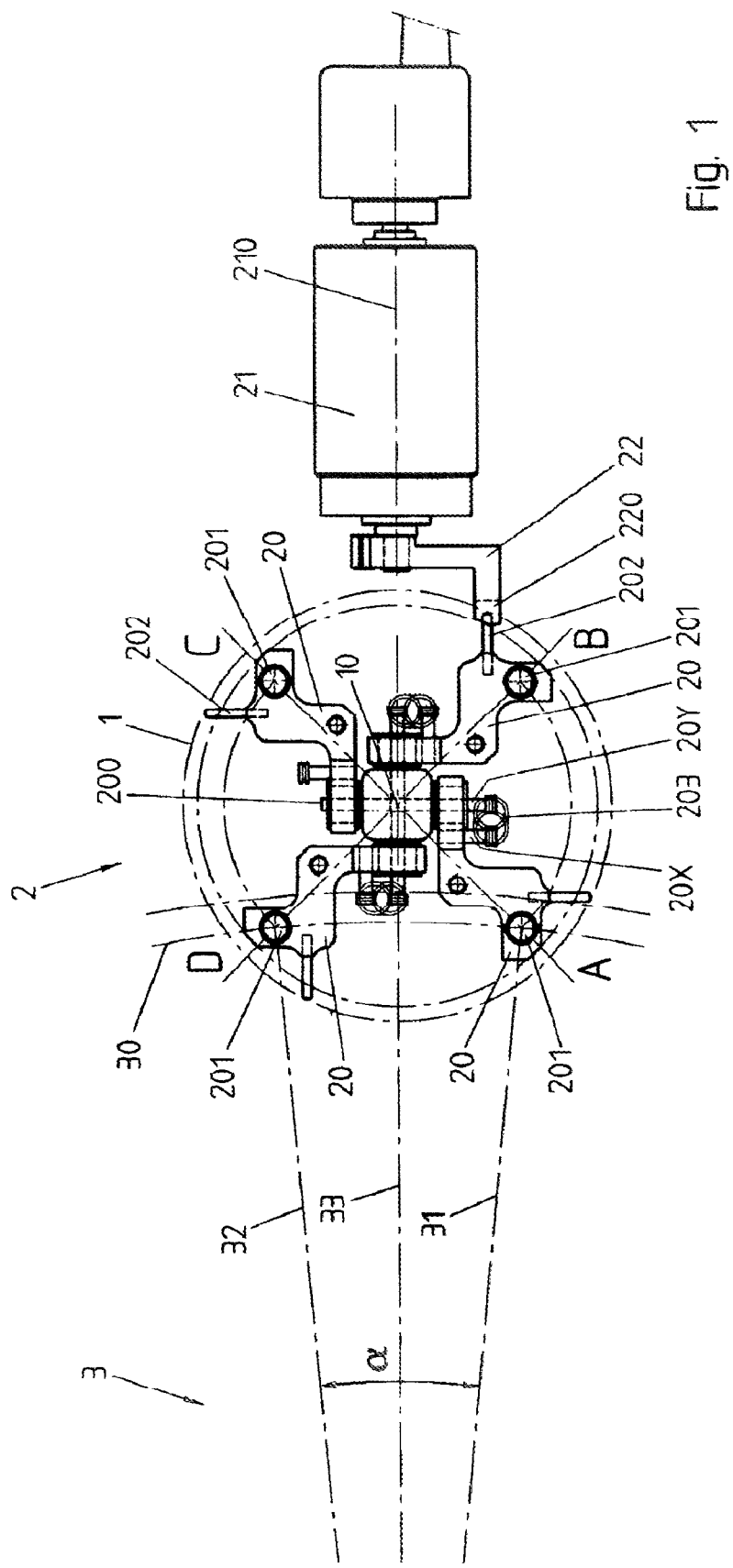

The present application is a continuation of international application PCT/EP2006/067910 (WO2007/057291), filed Oct. 30, 2006 and claiming priority of Swiss application CH1834/05, filed on Nov. 15, 2005.

TECHNICAL FIELD

The present invention concerns a device for turning over electronic components.

During manufacture or testing, electronic components pass through different processing locations in succession. The locations are often spaced regularly on the periphery of a barrel whose indexed rotation allows the components to be moved from one location to another.

Each of these locations is generally occupied by a processing station performing one or several operations on the electronic components presented to it. In certain cases, a processing station can occupy several locations. The entirety of the processing stations placed around the barrel thus forms a cycle of successive operations, for example electric or mechanic tests, conditioning operations etc., undergone by the electronic components conveyed on the barrel. For example, barrels with 16 or 32 locations are known.

The first processing station of the cycle is generally an entry station whose role consists essentially in bringing the electronic components from a reservoir or from another conveyor onto the barrel. The cycle can comprise one or several exit stations, thus enabling the components to exit at different stages of the cycle, for example according to the characteristics measured at a previous testing station.

It often happens that two successive processing stations must access opposite sides of the electronic components. For example, a marking station must access the upper side of the component to be marked whilst the electric testing of the integrated circuit is often performed in turned-over position, so-called "dead bug". It is thus necessary to turn over the electronic components between the two processing stations.

Patent application WO2004/023858 in the name of the applicant describes an advantageous turning-over device because it occupies only a single processing station. The turning over of the components is however caused by a linear actuator, for example a pneumatic jack. Such a jack is generally slower and more difficult to control than an electric rotary motor. The actuator acts on a rod whose vertical to-and-fro movements cause the components to turn over and pass from one component-carrier to another. The axis of this rod however is the same as the rotation axis of the component carriers. The motor driving the component carriers in rotation must thus be placed in an off-centered manner; in this solution, it is connected by a belt to the turning-over mechanism. It is however difficult to transmit extremely fast movements with a very high precision by means of belts. Furthermore, as the turned-over component returns to its initial location, it is necessary to perform turning-over operations in hidden time of the conveyor, which is only possible if the speed of the turning-over device is clearly greater than the speed of the conveyor. This solution is thus ideal essentially when the requirement of occupying a single location around the barrel is imperative.

Other solutions exist that call upon an arm at the extremity of which is placed a prehension element designed to grasp the electronic component and to hold it whilst the arm turns by 180° to turn over the component. However, making this prehension element, opposite a lateral side of the component, is delicate.

U.S. Pat. No. 6,468,023 describes a turning-over mechanism that calls upon an arm rotating around a horizontal axis. The arm goes back and forth between a start of turning over position and an end of turning over position. The motor actuating the arm must thus change its direction of rotation twice at each cycle, so that it is difficult to achieve very high speeds. Furthermore, the mass rotating with the arm is very great. Furthermore, the position of the turned-over component is not entirely controlled.

One aim of the present invention is thus to propose a device for turning over electronic components that is improved over the prior art devices.

Another aim is to propose a turning over device capable of turning over electronic components between two successive processing stations of a conveyor or of a rotating barrel.

According to the invention, these aims are achieved by means of a device for turning over electronic components having:

a turntable for driving the electronic components to be turned over in succession between the following stationary locations: a location for loading them onto the turntable, a start of turning over location, an end of turning over location, and a location for unloading the turntable, a turning-over device actuated by a fixed rotary motor, not linked to said turntable, for turning over said electronic components between said start of turning over position and the end of turning over position.

This solution has the advantage of using only rotary motors, which it is furthermore possible to make to turn in a single direction during the entire turning over cycle. In one embodiment, the motor driving the turntable always turns in the same direction whilst the stationary rotary motor actuating the turning-over device performs back-and-forth movements.

This solution also has the advantage of separating the turning-over motor from the turntable and thus of avoiding bulkiness around the turntable's rotation axis.

The invention will be better understood by reading the attached description illustrated by the figures, which show:

FIG. 1 a partial view of the turning-over device from above.

Figure 2:
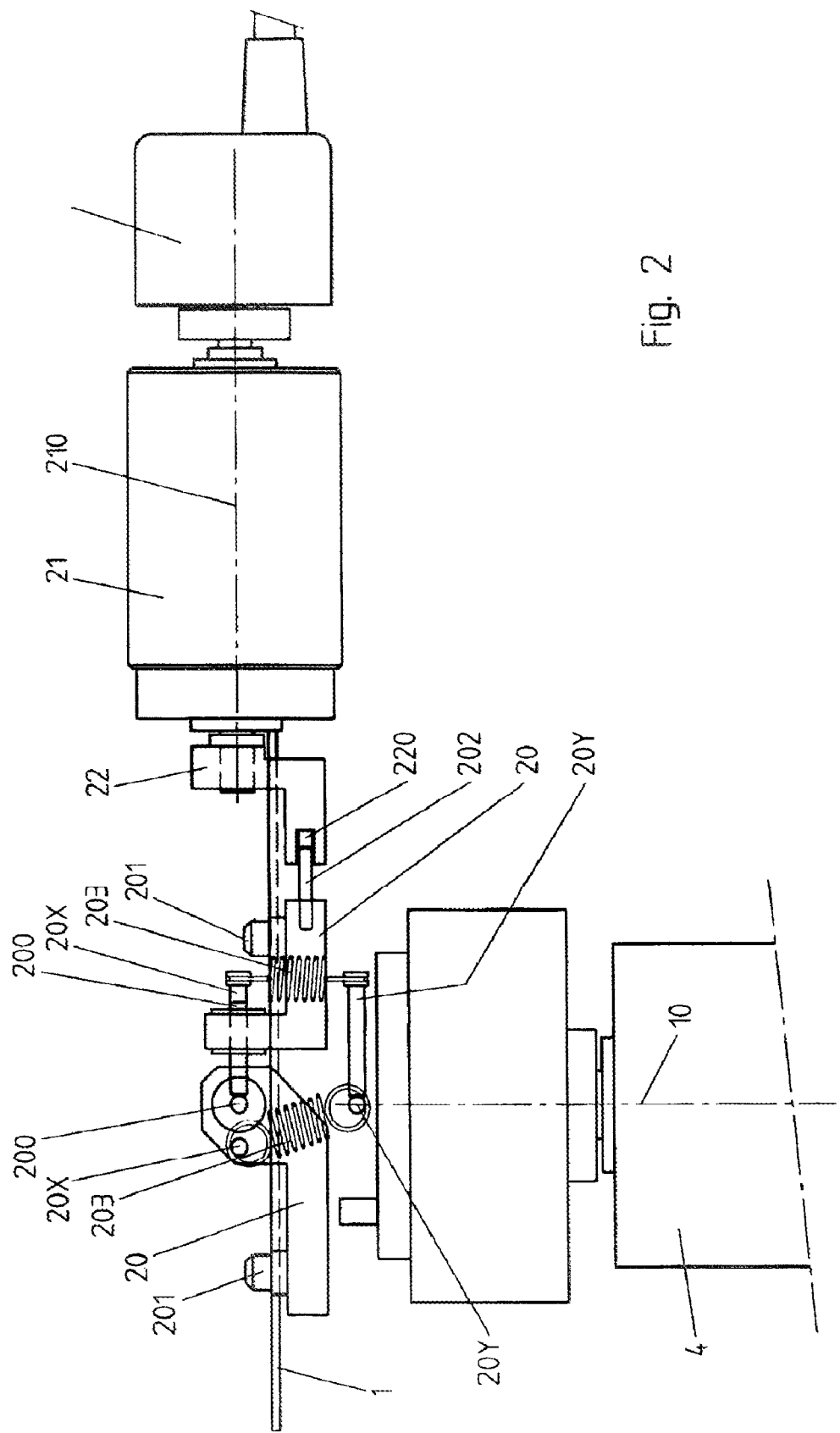

FIG. 2 a partial side view of the turning-over device.

The turning-over device of the invention is represented in FIGS. 1 and 2; only the components necessary for understanding the turning-over method have been illustrated. The turning-over device is designed to work together with a conveyor that brings a series of components into a first position, for example with the leads downwards, and retrieves them in turned-over position, for example with the leads upwards. In this preferred example, the conveyor is constituted by a rotating barrel 3 with a vertical axis of which only an angular portion of the periphery 30 is represented diagrammatically. The barrel comprises for example 16 or 32 peripheral locations on which the processing stations are placed. The barrel's rotation movements are preferably indexed; the components to be processed pass from one location to another at each step and thus run in succession through these different processing posts to be tested, marked, conditioned etc.

The turning-over device of the invention occupies two successive locations of the barrel 3. The electronic components to be turned over are extracted from the barrel at a first location and placed onto a first location A of the turntable 1 of the turning-over device. In this embodiment, the turntable 1 is horizontal; it is driven in rotation in indexed manner by the electric motor 4 (for example a direct current motor or a stepping motor), so as to pass through the four successive locations A-B-C-D. The component is turned over between the locations B and C and unloaded from the turntable 1 at the location D, where it joins a second location of the barrel 3. The reference 31 on FIG. 1 indicates the radius of the first location of the barrel from where the electronic components loaded on the turntable are extracted. Reference 32 corresponds to the radius of the second location where the components turned-over from the last location D of the turntable are positioned.

The component to be turned over is placed onto the component-carrier 20 at the location A from the barrel 3 thanks to positioning means, not represented. The positioning means as well as the shape of the component-carrier work together so that the position of the component on the component-carrier is determined with precision, and in reproducible manner, from one component to another. The component-carrier 20 is provided with a nozzle 201, connected to a pneumatic channel, not represented, that allows air to be aspirated or insufflated in order to hold the component in place or on the contrary to push it back. In one embodiment, the pneumatic circuit also allows a stable "neutral point" to be generated where the component is neither pushed back nor aspirated; a command enables it to pass directly to this neutral point. The pneumatic channel preferably comprises a circular path, not represented, allowing the nozzle to remain connected to the channel during its rotations.

The component-carrier 20 is articulated around the turning-over axis parallel to the horizontal plate 200. A spring 203, visible in FIG. 2, holds the component-carrier 20 in the significantly horizontal position illustrated in FIGS. 1 and 2. The spring 203 is tensed between the axis 20X, solidly united with the part 20, and the axis 20Y solidly united with the frame. The component-carrier 20 can preferably pivot by 180° at least around the axis 200, so as to turn over the component relative to a horizontal plane whilst moving it. The axis 200 is positioned above the plane of the component-carrier on which is placed the component to be turned over, in the middle of the component's thickness, so as to allow the turning over of a component-carrier at the location B above another component-carrier at the location C, with the nozzles of both component-carriers being then aligned around a same vertical axis.

One dimension of the component at the location B is aligned relative to the radius 31 that leads to the center of the barrel 3 passing through the first location of the barrel. The rotation axis 200 of the component-carrier at the location B is on the other hand parallel to the symmetry axis 33 between two successive locations of the barrel. By turning over the component around the axis 200, its dimension is being aligned relative to the radius 32 passing through the second location. The displacement of the component between the position B and the position C is thus a combination of a turning over around a horizontal axis and an angular rotation α around the vertical axis passing through the center of the barrel 3.

The turning over of the component-carrier at the location B is actuated by the turning-over motor 21, for example a direct current rotary motor or a stepping motor. The rotation axis 210 of the motor 21 is horizontal and in the same plane as the turning-over axis 200. In the illustrated preferred embodiment, the axis 210 and the axis 200 even become merged. The motor drives an eccentric part 22 whose extremity is provided with a slit 220 that can receive a horizontal rod 202 connected to the component-carrier at the location B. The eccentric part 22 is thus arranged so as to mesh only with the rod 202 associated to the component-carrier at the location B.

The rotation of the motor drives the rod 202 in a direction having a vertical component, thus raising the component-carrier towards the force of the spring 203 and turning it over around the axis 200, until it is superimposed to the component-carrier at the location C. The component can then be placed onto the component-carrier at the location C by controlling the pneumatic pressure on the nozzles 201 in appropriate manner, as will be described further below.

We will now describe the cycle run by a component between the locations A and D of the turntable. The component to be turned over leaves the barrel 3 and is placed on the location A of the component-carrier. The pneumatic circuit is controlled so as to hold the component in place by air aspiration through the nozzle 201 of this location. Other means for holding the component can be used within the frame of the invention, including mechanical prehension means.

The motor 4 then makes the turntable 1 with the four component-carriers pivot by 90° in anti-clockwise direction, so that the component now finds itself at the start of turning over location B. The exact amplitude of the rotation is preferably controlled by means of an angular encoder supplying a retroaction signal to a control electronic of the motor 4. During this rotation, the rod 202 associated to the component-carrier comes to lodge in the slit 220 of the eccentric part 22.

The turning over is then performed by means of a motor 21 that actuates the eccentric part 22 so as to raise the component-carrier 20 to the location B and make it pivot by 180° around the axis 200. Again, the amplitude of the rotation of the motor 21 is controlled by means of a second angular encoder acting on the control current of the motor 21 or thanks to end-of-travel detectors. The air vacuum under the nozzle 201 is maintained during turning over so as to hold the component in place. Simultaneously, the nozzle 201 of the component-carrier at the location C is actuated by the pneumatic system so as to create a slight air vacuum or a neutral pressure.

At the end of the turning over, when the component finds itself above the nozzle at the location C, the pneumatic system is controlled so as to interrupt the air aspiration by the nozzle linked to the turned-over component-carrier B, and to create or increase the air vacuum of the nozzle linked to the component-carrier C. It is even possible to create a slight overpressure in the pneumatic circuit linked to the component-carrier B, so as to push back the component. The component is then lifted from the component-carrier B and attracted by the component-carrier C, its position being controlled accurately.

The component-carrier B then returns to its initial location B. In a first embodiment, it is sent to its initial location by means of the motor 21 that performs a there-and-back movement to place the component-carrier back in its position B. This embodiment however has the disadvantage of requiring a bidirectional motor 21 and to need inversions of its direction of rotation, which slows down the process. In another embodiment, the spring 203 is used to bring the component-carrier back into its initial position. To this end, the turntable 1 resumes its rotation in anti-clockwise direction until the rod 201 disengages from the slit 220 of the eccentric part. The spring 203 then exerts a return force to return the component-carrier to its initial position B.

The cycle continues with the rotation of the turntable by 90° in anti-clockwise cycle. The component thus passes from the location C to the location D, from where it can be unloaded from the turntable 1 and transferred in turned-over position to the conveyor.

The turntable 1 comprises 4 locations for components 1. It is of course possible to begin a new cycle of turning over the next component before the first component has left the turntable. In a preferred embodiment, a new component is loaded onto the location A at each rotation of the turntable and a turned-over component is simultaneously unloaded form the location D. The component passing directly from the location B to the location D between two rotations of the turntable, it is thus possible to occupy simultaneously three locations of the turntable 1 and to load respectively unload one component at each rotation of the barrel 3. Thus, no position of the barrel remains empty: at each step, one component is unloaded onto the location A and another turned-over component is loaded from the location D.

The turning-over device of the invention comprises four successive locations A, B, C and D. It is however possible within the frame of the invention to provide turning-over devices with a different number of locations. For example, the component to be turned over could be loaded directly onto the start of turning over location or directly unloaded from the end of turning over location in order to reduce the number of locations. Conversely, it is also possible to provide intermediary locations for intermittent storage or for performing additional operations, for example additional turning-over operations along the same axis 200 or along another, for example orthogonal, axis. Furthermore, marking, testing, sorting operations for example could also be performed at these intermediary locations.

In order that the operations described here above can be performed correctly and in order to ensure the synchronism of the different movements, all the displacements of the barrel, of the motors 4 and 21 as well as the air pressures in the different chambers of the pneumatic circuit are preferably controlled by a control system, not represented, for example a programmable numeric system of the type CNC (computerized numeric control). The control system can be programmed by a program that can be commercialized or updated through appropriate computer data carriers.

In the description of the preferred embodiment given here above by way of example, the turning-over device is associated to a circular barrel. It is however possible within the frame of the invention to associate the turning-over device to another type of conveyor, for example a linear conveyor.

LIST OF ELEMENTS

1 Turntable
10 Rotation axis of the turntable
A Loading location
B Start of turning over location
C End of turning over location
D Unloading location
2 Turning-over device
20 Component-carriers
200 Turning-over axis of the component-carrier
201 Nozzle
202 Rod
203 Component-carrier return spring
20X Fastening axis of the spring onto the part 20
20Y Fastening axis of the spring onto the part linked to the frame
21 Fixed motor
210 Axis of the fixed motor
22 Eccentric part
220 Slit
3 Barrel
30 Circumference linked to the barrel
31 Axis position 1 on the barrel
32 Axis position 2 on the barrel
33 Symmetry axis between location 1 and location 2
α Angle between two successive positions of the barrel
4 Motor of the turntable

The invention claimed is:

1. Device for turning over electronic components having:
an indexed turntable for driving the electronic components to be turned over in succession as the turntable is indexed in step-by-step fashion between the following stationary locations: a location (A) for loading a component onto the turntable, a start of turning over location (B), an end of turning over location (C), and a location (D) for unloading the turntable,
a turning-over device having at least one component-carrier linked to and indexed with said turntable, which component-carrier is turnable and actuated by a fixed rotary motor, for turning over said electronic component between said start of turning over position and the end of turning over position.

2. The device of claim 1, wherein said stationary locations are distinct from one another.

3. The device of claim 2, wherein said turning over device is arranged for turning over said electronic components by 180° around a turning-over axis parallel to said turntable.

4. The device of claim 1, having a pneumatic device working with said turntable for holding or repelling said electronic components.

5. The device of claim 1, having control means arranged for making said turntable turn always in the same direction in indexed manner around a vertical axis.

6. The device of claim 1, said fixed rotary motor having an axis parallel to said turntable.

7. The device of claim 1, wherein said at least one component-carrier is articulated around a turning-over axis parallel to said turntable and is actuated by said fixed motor so that the carrier can be turned over between said start of turning over location (B) and said end of turning over location (C) in order to place there said electronic component in turned-over position.

8. The device of claims 7, wherein said axis of the fixed motor and said turning-over axis are in the same vertical plane.

9. The device of claim 8, wherein said axis of the fixed motor and said turning-over axis merge.

10. The device of claim 7, having an eccentric part driven by said fixed motor in rotation around said turning-over axis and arranged for meshing in succession with said successive component-carriers at the start of turning over location (B).

11. The device of claim 10, wherein said eccentric part and said component-carrier are arranged so as to be able to slide one relative to the other along a horizontal direction and to be solidly united one to another along a vertical direction.

12. The device of claim 1, wherein said electronic component is made to pivot around a vertical axis by a non-zero angle between the start of turning over location (B) and the end of turning over location (C).

13. Method for turning over electronic components having the following steps:
loading the electronic component to be turned over onto a component-carrier at a first location (A) of a turntable,
incrementally indexing in step-by-step fashion said turntable so as to place said electronic component at a start of turning over location (B),
turning over said electronic component by turning over said component-carrier, which is actuated by a fixed rotary motor, so as to place said electronic component in turned-over position onto an end of turning over location (C) distinct from said start of turning over location,
unloading said electronic component from an unloading location (D) of the turntable.

14. The method of claim 13, wherein said turntable is pivoted 90° after turning over of said electronic component and before its unloading.

15. The method of claim 13, including the step of placing several electronic components simultaneously onto several locations of said turntable.

16. The method of claim 13, including the step of actuating said turntable by a rotary motor, and indexing the turntable and the turning over motor in stepwise fashion in a single direction.

17. The method of claim 13, wherein the displacement of said electronic component during turning over is the combination of a turning over around a horizontal axis and an angular rotation $\alpha$ around a vertical axis.

18. The method of claim 13, including the steps of meshing said fixed rotary motor with the component-carrier of said start of turning over location (B) and unmeshing said fixed rotary motor from said component-carrier once the latter has pivoted.

19. System comprising:

an indexing barrel for driving electronic components between several consecutive processing locations in step-by-step fashion on a periphery of the indexing barrel, a turning-over device, mounted between two consecutive locations of the barrel in order to turn over the electronic components between these two locations, said turning over device having at least one component-carrier linked to and indexed with a turntable, which component-carrier is turnable and actuated by a fixed rotary motor for turning over said electronic components between a start of turning over position and an end of turning over position.

* * * * *